United States Patent
Sugawara et al.

(10) Patent No.: US 7,714,350 B2
(45) Date of Patent: May 11, 2010

(54) GALLIUM NITRIDE BASED SEMICONDUCTOR DEVICE AND METHOD OF MANUFACTURING SAME

(75) Inventors: Hideto Sugawara, Kanagawa-ken (JP); Chie Hongo, Kanagawa-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 279 days.

(21) Appl. No.: 11/396,922

(22) Filed: Apr. 4, 2006

(65) Prior Publication Data

US 2006/0220044 A1  Oct. 5, 2006

(30) Foreign Application Priority Data

Apr. 5, 2005 (JP) .............................. 2005-108474

(51) Int. Cl.
*H01L 33/00* (2006.01)
(52) U.S. Cl. .................. 257/102; 257/103; 257/97; 257/E33.033; 257/E33.034
(58) Field of Classification Search .................. 257/102
See application file for complete search history.

(56) References Cited

U.S. PATENT DOCUMENTS

| | | | | |
|---|---|---|---|---|
| 5,693,963 | A * | 12/1997 | Fujimoto et al. | ............... 257/94 |
| 5,945,689 | A | 8/1999 | Koike et al. | |
| 6,020,602 | A | 2/2000 | Sugawara et al. | |
| 6,221,684 | B1 | 4/2001 | Sugawara et al. | |
| 6,365,923 | B1 | 4/2002 | Kamei et al. | |
| 6,806,507 | B2 | 10/2004 | Ishida | |
| 2003/0203629 | A1 | 10/2003 | Ishibashi et al. | |
| 2004/0004225 | A1 | 1/2004 | Sung et al. | |

FOREIGN PATENT DOCUMENTS

| | | |
|---|---|---|
| DE | 10134181 A1 | 2/2002 |
| JP | 08-325094 | 12/1996 |
| JP | 11-177134 | 7/1999 |
| JP | 2001-298214 A1 | 10/2001 |

OTHER PUBLICATIONS

Amano, et. al., "P-Type Conduction in Mg-Doped GaN Treated with Low-Energy Electron Beam Irradiation (LEEBI)", Japanese Journal of Applied Physics, Dec. 1989, vol. 28, No. 12, pp. L2112-L2114.

(Continued)

*Primary Examiner*—Jerome Jackson, Jr.
(74) *Attorney, Agent, or Firm*—Banner & Witcoff, Ltd.

(57) ABSTRACT

A gallium nitride based semiconductor device comprises: a first gallium nitride based semiconductor film doped with magnesium; and a second gallium nitride based semiconductor film provided on the first gallium nitride based semiconductor film and doped with magnesium. The first gallium nitride based semiconductor film has substantially flat distributions of magnesium concentration and hydrogen atom concentration, and the magnesium concentration is higher than the hydrogen atom concentration. The second gallium nitride based semiconductor film has a first region in which the magnesium concentration decreases and the hydrogen atom concentration increases toward the surface, and the magnesium concentration in the first region is higher than the hydrogen atom concentration in the first region and higher than the magnesium concentration in the first gallium nitride based semiconductor film.

20 Claims, 15 Drawing Sheets

OTHER PUBLICATIONS

Nakamura, et al., "Hole Compensation Mechanism of P-Type GaN Films", Japan Journal of Applied Physics, May 1992, vol. 31, Part 1, No. 5A, pp. 1258-1266.

Tanamoto, et. al., "A Percolation Approach to Dielectric Breakdown Statistics", Japanese Journal of Applied Physics, Mar. 1997, vol. 36, Part 1, No. 3B, pp. 1439-1442.

Degraeve, et. al., "New Insights in the Relation Between Electron Trap Generation and the Statistical Properties of Oxide Breakdown", IEEE Transactions on Electron Devices, Apr. 1998, vol. 45, No. 4, pp. 904-911.

Extended European Search Report dated Jun. 4, 2009 in Application No. 06007200.6.

Hanser, A D, et al. "Growth, doping and characterization of epitaxial thin fils and patterned structures of A1N, GaN and A1xGa1-xN" Diamond and Related Materials, Elsevier Science Publishers, Amsterdam, Netherlands, vol. 8, No. 2-5, Mar. 1, 1999, pp. 288-294.

Sugiura, Lisa, et al., "p-type conduction in as-grown Mg-doped GaN grown by metalorganic chemical vapor deposition" Applied Physics Letters, AIP, American Institute of Physics, Melville, MY, US, vol. 72, No. 14m April 6, 1998, pp. 1748-1750.

Notification of Reasons for Refusal dispatched Sep. 16, 2009 in Japanese Application No. 2006_103819 and English translation thereof.

European Written Opinion dated Oct. 26, 2009, in EP Application No. 06007200.6 - Citing to EP Search Report.

* cited by examiner

GALLIUM NITRIDE BASED SEMICONDUCTOR DEVICE AND METHOD OF MANUFACTURING SAME

CROSS-REFERENCE TO RELATED APPLICATIONS

This application is based upon and claims the benefits of priorities from the prior Japanese Patent Application No. 2005-108474, filed on Apr. 5, 2005; the entire contents of which are incorporated herein by reference.

BACKGROUND OF THE INVENTION

Gallium nitride based materials have a wide bandgap and high saturation electron velocity. For this reason, they are desirable materials for high-speed electronic devices such as field effect transistors (FET) and heterojunction bipolar transistors (HBT) as well as for blue light emitting devices.

It is important to form p-type and n-type conducting layers with high controllability for implementing light emitting devices and electronic devices. For gallium nitride based semiconductor materials, an n-type conducting layer can be formed by using silicon (Si) for n-type impurity. In contrast, while magnesium (Mg) or zinc (Zn) is used for p-type impurity, they have a low activation rate because of their deep impurity level. In addition, in the crystal growth based on the metal organic chemical vapor deposition (MOCVD) method used for growing a gallium nitride based crystal, hydrogen atoms resulting from the decomposition of hydrogen used in a carrier gas are combined with magnesium to form Mg—H, thereby deactivating magnesium.

As a method for increasing the magnesium activation rate, there is disclosed a technique of postprocessing based on electron beam irradiation (H. Amano et al., Jpn. J. Phys. 28 (1989) L2112) and heat treatment (S. Nakamura et al., Jpn. J. Appl. Phys. 31 (1992) 1258).

As another method of increasing the magnesium activation rate, there is disclosed a method of using an inert gas as a carrier gas during growth (JP 8-325094A (1996)).

SUMMARY OF THE INVENTION

According to an aspect of the invention, there is provided a gallium nitride based semiconductor device comprising: a first gallium nitride based semiconductor film doped with magnesium; and a second gallium nitride based semiconductor film provided on the first gallium nitride based semiconductor film and doped with magnesium, the first gallium nitride based semiconductor film having substantially flat distributions of magnesium concentration and hydrogen atom concentration, and the magnesium concentration being higher than the hydrogen atom concentration, and the second gallium nitride based semiconductor film having a first region in which the magnesium concentration decreases and the hydrogen atom concentration increases toward the surface, and the magnesium concentration in the first region being higher than the hydrogen atom concentration in the first region and higher than the magnesium concentration in the first gallium nitride based semiconductor film.

According to other aspect of the invention, there is provided a gallium nitride based semiconductor device comprising: a first gallium nitride based semiconductor film doped with magnesium; and a second gallium nitride based semiconductor film provided on the first gallium nitride based semiconductor film and doped with magnesium, the first gallium nitride based semiconductor film having substantially flat distributions of magnesium concentration and hydrogen atom concentration, and the magnesium concentration being higher than the hydrogen atom concentration, and the second gallium nitride based semiconductor film having a first region in which the magnesium concentration and the hydrogen atom concentration increase toward a surface, and the magnesium concentration in the first region being higher than the hydrogen atom concentration in the first region and higher than the magnesium concentration in the first gallium nitride based semiconductor film.

According to other aspect of the invention, there is provided a method of manufacturing a gallium nitride based semiconductor device comprising: growing a first gallium nitride based semiconductor film doped with magnesium by using a metal organic chemical vapor deposition method and feeding a carrier gas containing hydrogen more than nitrogen; temporarily interrupting supply of a group III source gas after growing the first gallium nitride based semiconductor film; and growing a second gallium nitride based semiconductor film doped with magnesium on the first gallium nitride based semiconductor film by using the metal organic chemical vapor deposition method and feeding a carrier gas containing nitrogen more than hydrogen.

DETAILED DESCRIPTION OF THE INVENTION

Embodiments of the invention will now be described with reference to the drawings.

Figure 1:
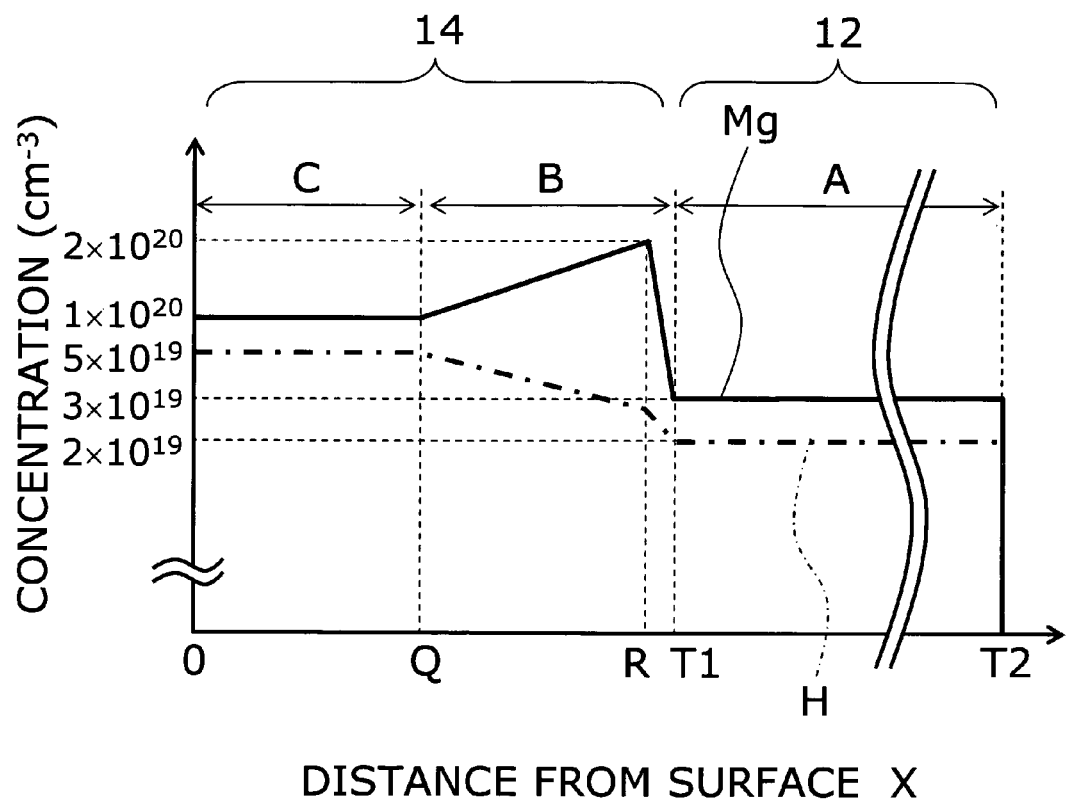
FIG. 1 is a graphical diagram showing the design values of the concentration distribution for magnesium and hydrogen atoms in a gallium nitride based semiconductor device according to a first embodiment of the invention.

FIG. 1 is a graphical diagram that schematically shows the magnesium concentration distribution and hydrogen atom concentration distribution in a gallium nitride based semiconductor device according to a first embodiment of the invention.

Figure 2:
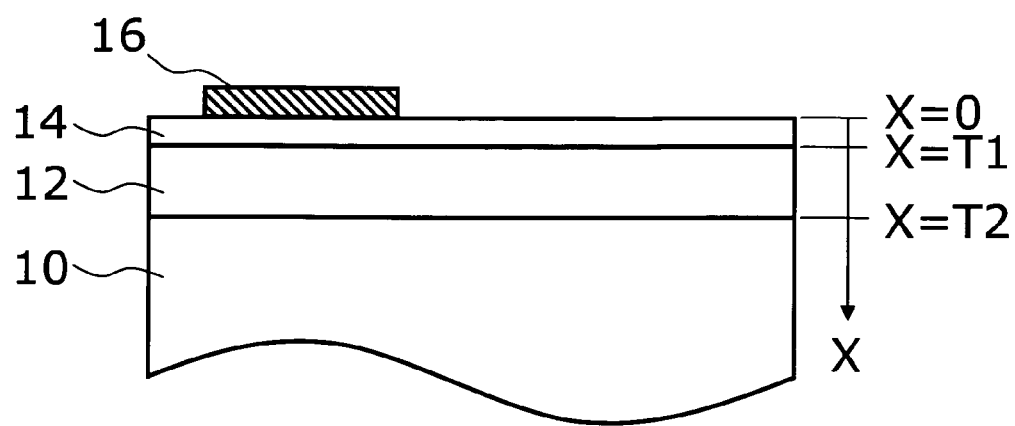
FIG. 2 is a schematic cross section showing the relevant part of the gallium nitride based semiconductor device according to the first embodiment of the invention.

FIG. 2 is a schematic cross section showing the relevant part of the gallium nitride based semiconductor device according to the first embodiment.

Note that the "gallium nitride based semiconductor" used herein includes semiconductors having any composition represented by the chemical formula $In_xGa_yAl_{1-x-y}N$ (where $0 \leq x \leq 1$, $0 \leq y \leq 1$, $x+y \leq 1$) where the composition ratios x and y are varied in the respective ranges. Furthermore, the "gallium nitride based semiconductor" also includes semiconductors further containing group V elements other than N (nitrogen) and/or any of various impurities added for controlling conductivity types.

As shown in FIG. 2, the gallium nitride based semiconductor device of this embodiment has a structure including a GaN substrate 10 on which a first gallium nitride based semiconductor film 12 doped with magnesium as p-type impurity and a second gallium nitride based semiconductor film 14 doped with magnesium as p-type impurity are laminated in this order. Furthermore, a p-side electrode 16 is provided on the second gallium nitride based semiconductor film 14. The distance from the surface of the second gallium nitride based semiconductor film 14 is represented by a coordinate x, where the coordinate origin is set to the surface. That is, the second gallium nitride based semiconductor film 14 extends from x=0, the surface, to x=T1. The first gallium nitride based semiconductor film 12 extends from x=T1 to x=T2.

In FIG. 1, the horizontal axis corresponds to the coordinate x. The vertical axis represents the magnesium (p-type impurity) concentration (/cm$^3$) and hydrogen atom concentration (/cm$^3$). The magnesium concentration (Mg) is plotted by solid line, and the hydrogen atom concentration (H) is plotted by dot-dashed line. The region $0 \leq x \leq T1$ is occupied by the second gallium nitride based semiconductor film 14, and the region $T1 \leq x \leq T2$ is occupied by the first gallium nitride based semiconductor film 12. The design values of the magnesium concentration and hydrogen atom concentration are described later.

Here, a method of growing this laminated body is specifically described. This laminated body is formed, for example, by a crystal growth process based on the MOCVD method. In the MOCVD method, TMG (trimethylgallium) is used as a group III source, ammonia is used as a group V source, and Cp$_2$Mg (bis-cyclopentadienylmagnesium) is used as an impurity source for magnesium doping. Hydrogen and nitrogen are used as a carrier gas for introducing these sources into the substrate.

Figure 3:
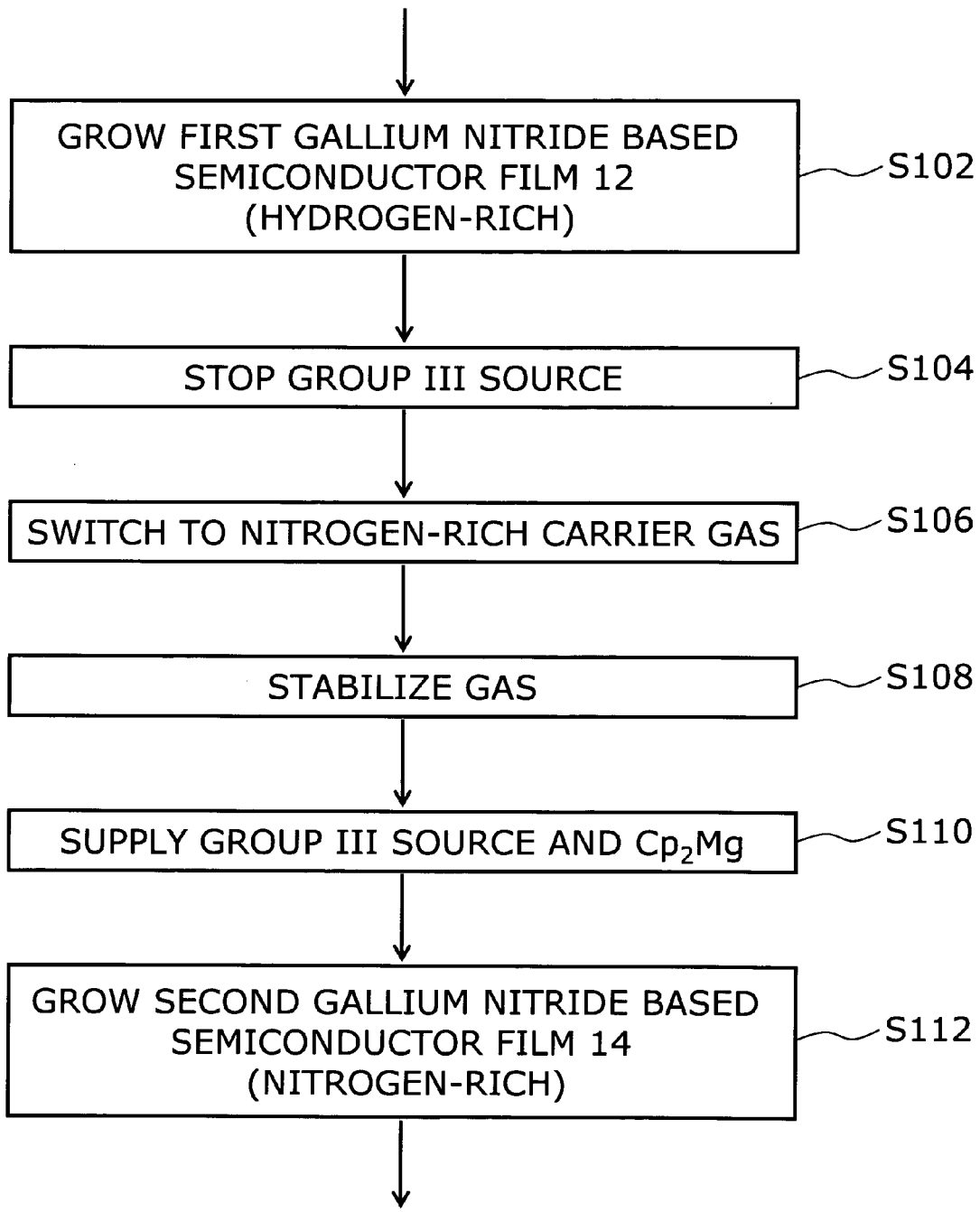
FIG. 3 is a flow chart showing the relevant part of a method of manufacturing a gallium nitride based semiconductor device according to this embodiment.

FIG. 3 is a flow chart showing the relevant part of a method of manufacturing a gallium nitride based semiconductor device according to this embodiment.

First, the surface of the GaN substrate 10 is cleaned with organic solvent and the like. The GaN substrate 10 is then introduced into a reaction chamber of the MOCVD apparatus via a load lock mechanism. The GaN substrate 10 is heated to 1100° C., for example, in an atmosphere supplied with a carrier gas and ammonia. After the substrate temperature reaches 1100° C., the growth source TMG and impurity source Cp$_2$Mg are supplied to start growth (step S102). In this embodiment, after the first gallium nitride based semiconductor film 12 is grown to the thickness of T2, the supply of group III source TMG is temporarily stopped (step S104).

Subsequently, the carrier gas is gradually switched from hydrogen-rich to nitrogen-rich for 30 seconds, for example (step S106), and this condition is maintained for 10 seconds for stabilization. Next, the supply of the group III source TMG and Cp$_2$Mg is resumed (step S110). Subsequently, the second gallium nitride based semiconductor film 14 is grown to the thickness of T1 (step S112). After the second gallium nitride based semiconductor film 14 is grown, the supply of the source gas TMG and Cp$_2$Mg is stopped, and the temperature is lowered in the atmosphere of nitrogen and ammonia. When the substrate temperature reaches 350° C., the supply of ammonia is also stopped.

Next, an example condition of gas flow rate in growing the first gallium nitride based semiconductor film 12 is presented. The total flow rate can be set to 30 slm, including ammonia 9.5 slm, and as a carrier gas, hydrogen 15.5 slm/nitrogen 5.0 slm. This carrier gas is referred to as "hydrogen-rich gas" because the hydrogen flow rate is larger than the nitrogen flow rate. Here, "slm" is a unit of gas flow rate that represents the flow rate at 0° C., 101,325 pascal (Pa) in liter/min.

An example condition of gas flow rate in growing the second gallium nitride based semiconductor film 14 is as follows. The total flow rate can be set to 45 slm, including ammonia 4 slm, and as a carrier gas, hydrogen 0.3 slm/ nitrogen 40.7 slm. This carrier gas is referred to as nitrogen-rich gas because the nitrogen flow rate is larger than the hydrogen flow rate.

In both cases, hydrogen is used in the carrier gas for supplying the group III source TMG and impurity source Cp$_2$Mg. This is based on the experimental result that in hydrogen, these sources are readily decomposed and trapped into the crystal, whereas in nitrogen, these sources are not readily decomposed nor diffused into the carrier gas, which results in the roughness of the surface morphology. The proportion of hydrogen used in the carrier gas for the group III source, group V source, and impurity source is preferably 0.5 to 20% of the total flow rate, and more preferably 0.5 to 0.8% of the total flow rate if the nitrogen-rich condition is also taken into consideration.

It is also noted that the flow rate of ammonia is set to 4 slm in the condition of gas flow rate during the growth of the second gallium nitride based semiconductor film 14. The smaller the flow rate of ammonia is, the less the influence of hydrogen generated by the decomposition of ammonia can be. However, an excessively small flow rate of ammonia adversely affects crystal growth. Therefore the ammonia flow rate is preferably 5 to 10% of the total flow rate.

Given that ammonia is 5 to 10% of the total flow rate, the proportion of nitrogen gas in the total flow rate during the growth of the second gallium nitride based semiconductor film 14 is preferably 70 to 94.5%, and the proportion of hydrogen gas in the total flow rate is preferably 0.5 to 20% as described above.

Next, the graphical diagram of the distribution of magnesium concentration and hydrogen atom concentration shown in FIG. 1 is described in more detail. In this embodiment, for example, the magnesium concentration of the first gallium nitride based semiconductor film 12 is set to $3 \times 10^{19}$ cm$^{-3}$ (region A), and the magnesium concentration of the second gallium nitride based semiconductor film 14 is higher than this, set to $1 \times 10^{20}$ cm$^{-3}$ in the stationary region (region C). The magnesium concentration distributions are substantially flat in the growth region A. The substantially flat concentration distributions include the variation equal to or less than ±10% due to epitaxial growth controllability. This example is characterized in that, in the second gallium nitride based semiconductor film 14, the region B adjacent to the first gallium nitride based semiconductor film 12 (region A) can have a magnesium concentration higher than the predetermined value in the stationary region. More specifically, after the first gallium nitride based semiconductor film 12 is formed, the carrier gas switching (S106) and gas stabilization (S108) are carried out as illustrated in FIG. 3. Subsequently, the supply of the group III source and Cp$_2$Mg is resumed (S110). This procedure produces a region $R \leq x \leq T1$ where the magnesium concentration rapidly increases. At x=R, the magnesium concentration increases to a maximum of $2 \times 10^{20}$ cm$^{-3}$, then decreases toward the surface, and reaches equilibrium at the design value of $1 \times 10^{20}$ cm$^{-3}$ in the stationary region C of $0 \leq x \leq Q$. The region $R \leq x \leq T1$ may also be formed by the diffusion of magnesium during the growth of the second gallium nitride based semiconductor film 14. Furthermore, magnesium deposited on the growth front during the growth interruption may be trapped into the crystal with the start of the subsequent growth of the second gallium nitride based semiconductor film 14.

On the other hand, the hydrogen atom concentration increases toward the surface in the region B of $Q \leq x \leq T1$. However, the concentration gradient in $Q \leq x \leq R$ is different from that in $R \leq x \leq T1$ because of the variation of the amount of trapped hydrogen atoms associated with the magnesium concentration variation. Furthermore, the hydrogen atom concentration is made lower than the magnesium concentration not only in the nitrogen-rich growth regions B and C but also in the growth region A formed in the hydrogen-rich condition. The hydrogen atom concentration distributions are substantially flat in the growth region A. The substantially flat concentration distributions include the variation equal to or less than ±10% due to epitaxial growth controllability. Such a gallium nitride based laminated body is extremely effective for the structure of optical and electronic devices. More specifically, because the p-side electrode 16 is formed on the second gallium nitride based semiconductor film 14, it is preferred that the second gallium nitride based semiconductor film 14 have a high effective acceptor concentration (i.e., hole concentration). A higher effective acceptor concentration can be achieved in the present structure, where the concentration of magnesium can be made higher, and the concentration of hydrogen atoms that decrease the activation rate can be made lower.

Figure 4:
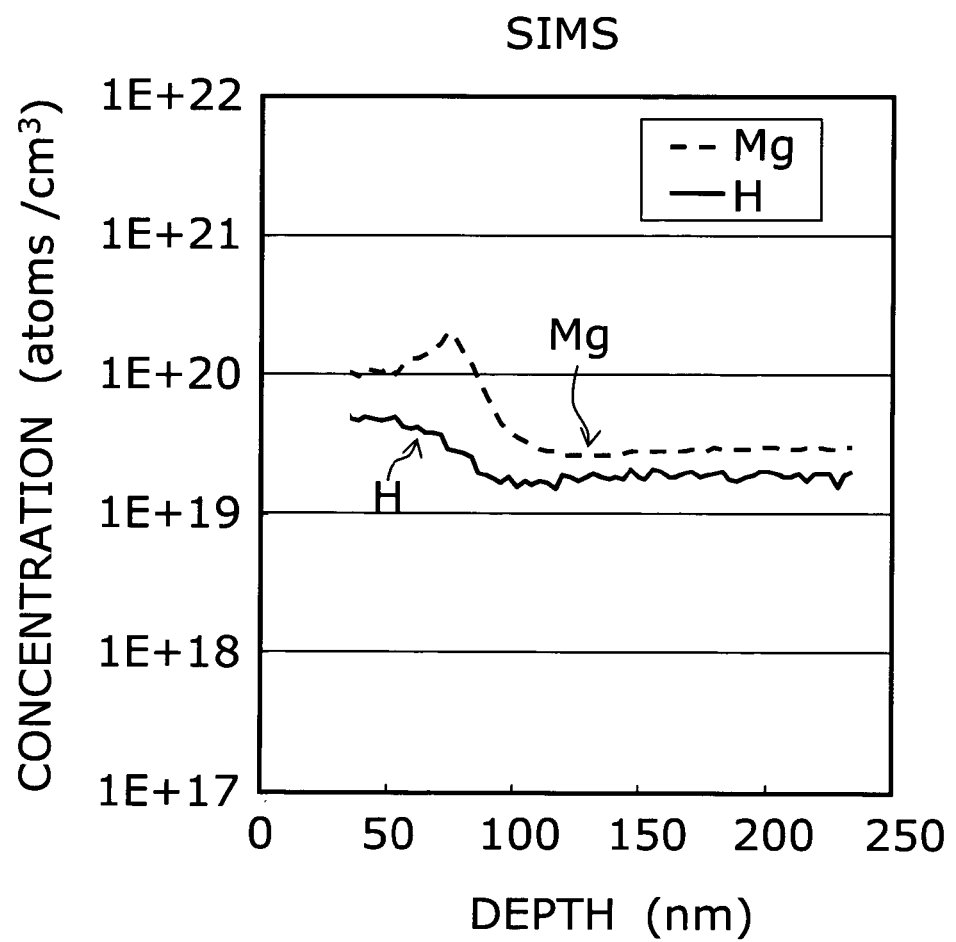
FIG. 4 is a graphical diagram showing SIMS actual measurements for the concentration distribution of magnesium and hydrogen atoms in a gallium nitride based semiconductor device according to the first embodiment of the invention.

FIG. 4 shows actual measurements for the x (nm) distribution of the concentration of magnesium (Mg) and hydrogen atoms (H) by a secondary ion mass spectrometer (SIMS). In this example, T1=100 nm, and T2=2.1 µm. The magnesium concentration is about $1 \times 10^{20}$ cm$^{-3}$ for $x \leq 50$, increases to a peak of about $2 \times 10^{20}$ cm$^{-3}$ in the range of $50 \leq x \leq T1$, and is about $3 \times 10^{19}$ cm$^{-3}$ for $100 \leq x$, being in good agreement with the distribution shown in FIG. 1. Likewise, the hydrogen atom concentration is about $5 \times 10^{19}$ cm$^{-3}$ for $x \leq 50$ and about $2 \times 10^{19}$ cm$^{-3}$ for $100 \leq x$, being in good agreement with the distribution described above with reference to FIG. 1.

In FIG. 4, data for the surface vicinity is omitted because the SIMS measurement is affected by adsorption in the vicinity of the surface of a measured sample, which often leads to errors in the measurements. Because the data shown in FIG. 4 is measured by SIMS from the high-concentration side (i.e., surface side), it may be affected by the "knock-on effect", where magnesium (Mg) and hydrogen (H) contained in the sample are embedded in the sample by primary ion beams. For this reason, it appears that the magnesium (Mg) and hydrogen atom (H) concentrations are varied more smoothly than their actual distributions at the interface between the region A grown using the hydrogen-rich carrier and the region B grown using the nitrogen-rich carrier. That is, it is contemplated that the magnesium (Mg) and hydrogen atom (H) concentrations vary more steeply than the measurement result shown in FIG. 4.

Next, the difference between this example and a comparative example investigated by the inventors is described.

In the comparative example, the first gallium nitride based semiconductor film 12 is formed with a thickness of 2.0 micrometers in the same hydrogen-rich growth condition as in the present example. Here, the growth interruption for temporarily stopping the supply of the group III source is inserted like the present example so that comparison can be made in the same condition. Subsequently, the second gallium nitride based semiconductor film 14 is formed with a thickness of 100 nanometers again in the hydrogen-rich growth condition.

Figure 5:
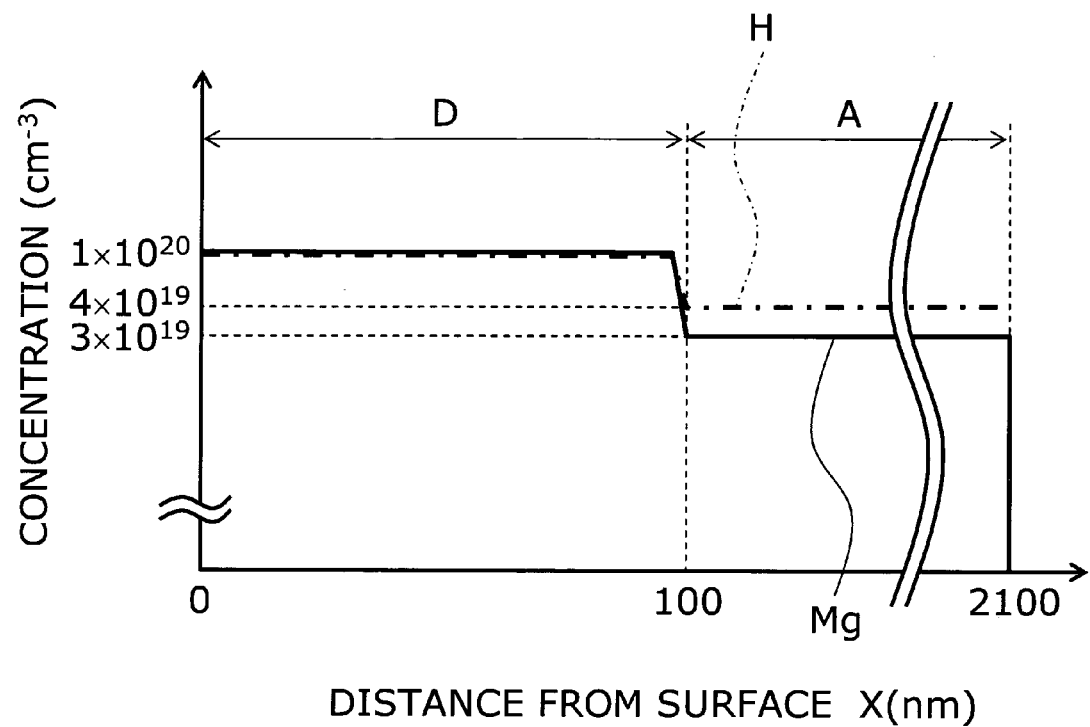
FIG. 5 is a graphical diagram illustrating the concentration distribution of magnesium and hydrogen atoms in a gallium nitride based semiconductor device according to a comparative example.

FIG. 5 is a graphical diagram showing the magnesium concentration distribution (indicated by solid line) and the hydrogen atom (H) concentration distribution (indicated by dot-dashed line) in the comparative example. Here, T1=100 nm, and T2=2.1 µm.

The hydrogen atom (H) concentration of the first gallium nitride based semiconductor film 12 (region A) is $4 \times 10^{19}$ cm$^{-3}$ (actual measurement by SIMS) in the comparative example, but reduced in half to $2 \times 10^{19}$ cm$^{-3}$ in the first embodiment. This can be explained as follows. In the present example, the hydrogen atom concentration was $4 \times 10^{19}$ cm$^{-3}$ immediately after the growth, but is decreased to $2 \times 10^{19}$ cm$^{-3}$ when the second gallium nitride based semiconductor film 14 is grown, because the atmospheric gas is switched to nitrogen-rich and therefore hydrogen atoms that were in equilibrium within the film 14 are ejected out of the crystal.

The hydrogen atom (H) concentration of the second gallium nitride based semiconductor film 14 (region D) is $1 \times 10^{20}$ cm$^{-3}$ (actual measurement by SIMS) down to a depth of 100 nanometers in the comparative example. On the other hand, in this embodiment, the hydrogen atom concentration in the second gallium nitride based semiconductor film 14 increases toward the surface from $2 \times 10^{19}$ cm$^{-3}$ to $5 \times 10^{19}$ cm$^{-3}$ in the region B of $Q \leq x \leq T1$ adjacent to the region A, and remains constant at about $5 \times 10^{19}$ cm$^{-3}$ in the region C of $0 \leq x \leq Q$, being lower than in the comparative example in both regions.

Thus in the comparative example, the hydrogen atom concentration is higher than the magnesium concentration in the first gallium nitride based semiconductor film 12 (region A), and is generally equal to the magnesium concentration in the second gallium nitride based semiconductor film 14. This results in the increase of magnesium combined with hydrogen atoms, which raises the deactivation rate. According to our electric characterization, the film of the comparative example is highly resistive and difficult to use for device operation without heat treatment.

Next, the cause of the variation of magnesium and hydrogen atom concentration distributions in the region B in this embodiment is described in more detail. The gallium nitride based semiconductor films in this example are grown using an MOCVD apparatus.

Figure 6:
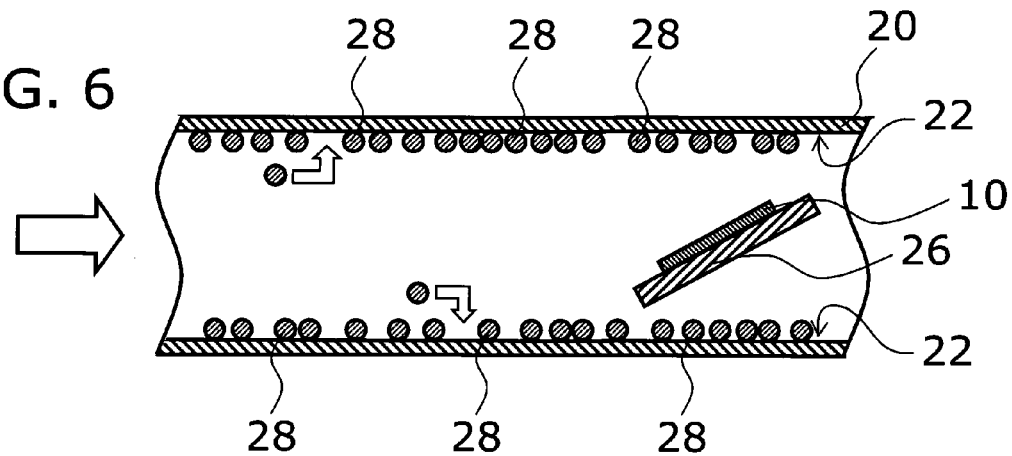
FIG. 6 is a schematic diagram showing the adsorption of $Cp_2Mg$ and its decomposition products on the reaction furnace wall.
Figure 7:
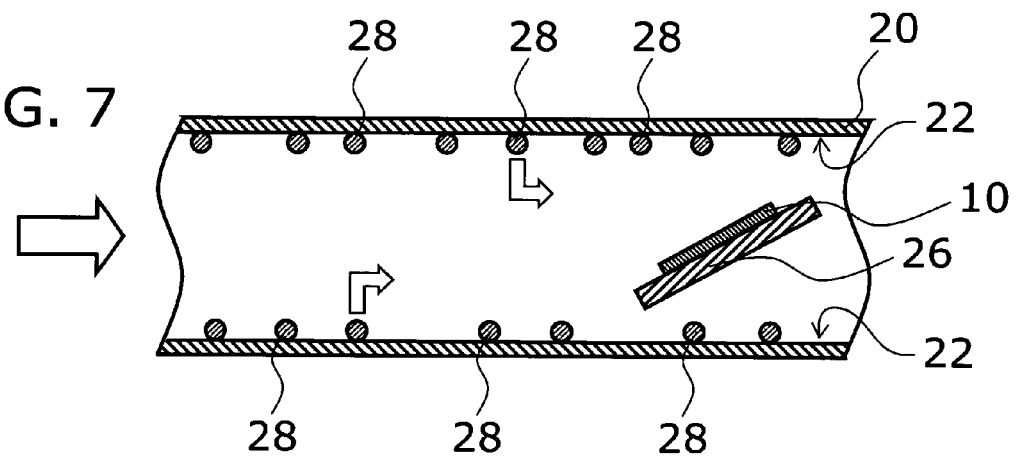
FIG. 7 is a schematic diagram showing the desorption of $Cp_2Mg$ and its decomposition products from the reaction furnace wall.
Figure 8:
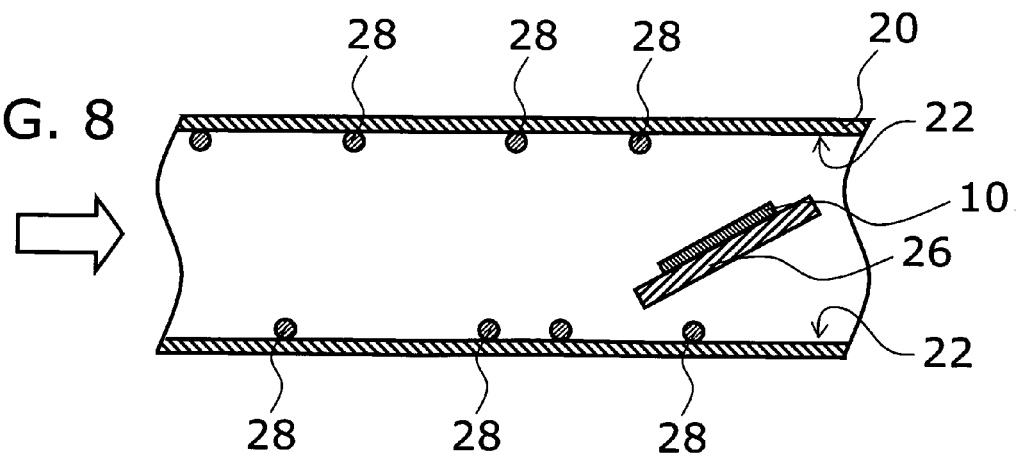
FIG. 8 is a schematic diagram showing the equilibrium of adsorption and desorption on the reaction furnace wall.

FIGS. 6 to 8 are schematic diagrams showing the adsorption and desorption of $Cp_2Mg$ and its decomposition products on the reaction furnace wall of a reaction chamber in the MOCVD apparatus. In FIG. 6, a carrier gas, group III source gas, and impurity gas are introduced into a quartz tube 20 from its left side. The GaN substrate 10 is placed on a heated susceptor 26.

In gallium nitride based materials, the activation rate of magnesium, which is p-type impurity, is generally low. It is therefore necessary to supply a large amount of magnesium in order to obtain a predetermined effective acceptor concentration (i.e., hole concentration). In this case, if a hydrogen-rich carrier gas atmosphere is used for growth, a large amount of $Cp_2Mg$ and its decomposition products remain as residues adsorbed on the reaction furnace wall 22 and the like of the MOCVD apparatus even after the gas supply is stopped. These residues are trapped into the grown film during the subsequent process of crystal growth. This phenomenon is common to MOCVD apparatuses used for the growth of gallium nitride based semiconductors and often called the "magnesium memory effect" (J. Crystal Growth, Vol. 93 (1988) p. 624).

This phenomenon occurs also in this embodiment during the growth of the first gallium nitride based semiconductor film 12 in the hydrogen-rich carrier gas atmosphere. As shown in FIG. 6, $Cp_2Mg$ and its decomposition products are adsorbed on the reaction furnace wall 22 during the growth of p-type gallium nitride based semiconductor. In contrast, according to the investigation by the inventors, as shown in FIG. 8, the amount of $Cp_2Mg$ and its decomposition products adsorbed on the reaction furnace wall 22 decreases during the growth of the second gallium nitride based semiconductor film 14 in the nitrogen-rich carrier gas atmosphere.

More specifically, after the hydrogen-rich carrier gas atmosphere is switched to the nitrogen-rich carrier gas atmosphere, the amount of adsorption onto the reaction furnace wall 22 is exceeded by the amount of desorption, and thus a period of transition occurs in which the amount of magnesium trapped into the crystal increases (FIG. 7). The crystal can be doped with a larger amount of magnesium as the amount of desorption from the reaction furnace wall 22 increases. Furthermore, at this time, it is not needed to increase the amount of hydrogen used as a carrier gas for magnesium. The activation rate of dopant magnesium can thus be increased. Moreover, hydrogen trapping presumably decreases when the large amount of magnesium desorbed from the reaction furnace wall 22 is trapped into the crystal.

It is contemplated that the transient variation of magnesium and hydrogen atom concentrations thus occurs in the region B ($Q \leq x \leq T1$) shown in FIG. 1.

The magnesium and hydrogen atom concentrations in the region B can be controlled by the amount of $Cp_2Mg$ supply, the type of carrier gas, and the material and structure of the reaction furnace wall 22. According to the investigation by the inventors, quartz exceeds stainless steel (SUS) in the adsorption effect of $Cp_2Mg$. Therefore, when the MOCVD reaction chamber is constructed from a combination of quartz and other materials, the amount of adsorption can be controlled by adjusting the configuration and area of quartz parts as appropriate.

Note that without the growth interruption associated with the carrier gas switching, the steep interface cannot be obtained. On the other hand, if the growth interruption is too long, most of magnesium desorbed from the reaction furnace wall is ejected out of the reaction furnace, which prevents a region highly doped with magnesium from being formed in the crystal.

According to the experiment by the inventors, the second gallium nitride based semiconductor film 14 in the present example achieves a resistivity of about 2 Ω·cm without any postprocessing such as electron beam irradiation and heat treatment. This satisfies the requirements for the p-type conductivity for forming a device.

Furthermore, according to the measurement of the effective acceptor concentration by the C-V method, it is $3 \times 10^{18}$ $cm^{-3}$ in the region C and $1 \times 10^{19}$ $cm^{-3}$ in the region B closed to the interface with the region A. These measurements of resistivity and effective acceptor concentration demonstrate that the magnesium activation rate is improved by controlling the amount of trapped hydrogen (H).

Figure 9:
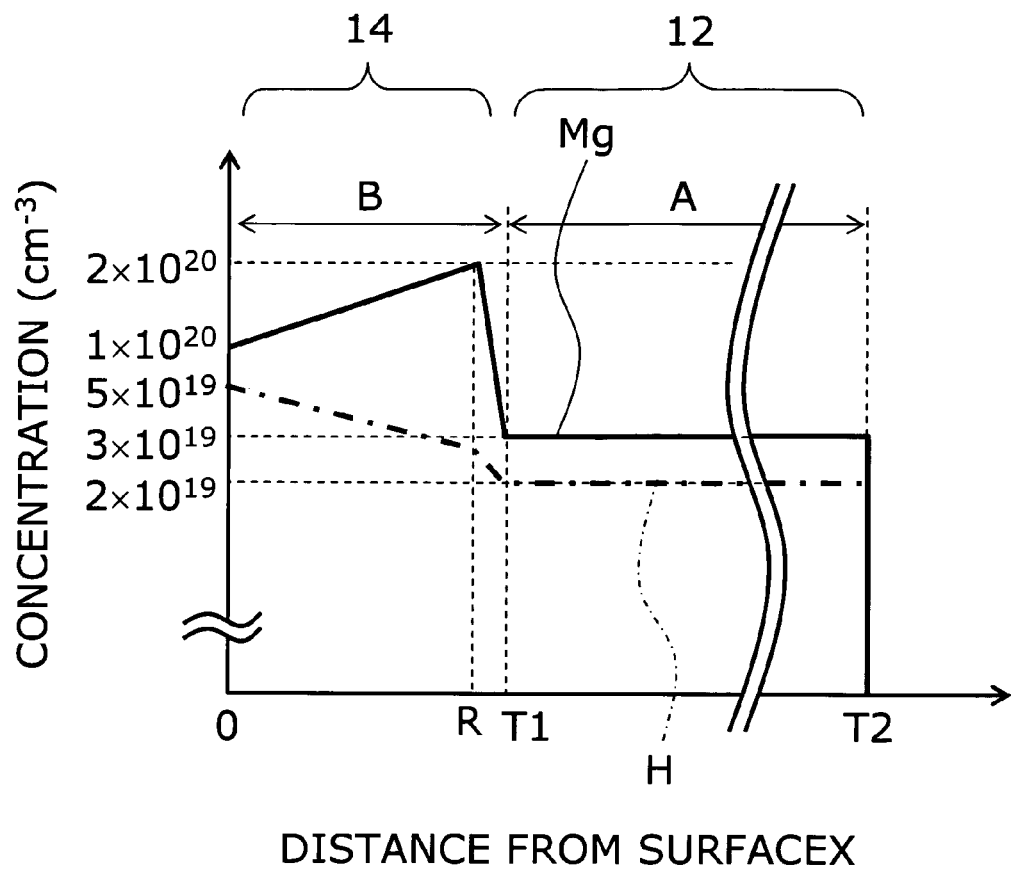
FIG. 9 is a graphical diagram illustrating the concentration distribution in a gallium nitride based semiconductor device according to a variation of the embodiment of the invention.

FIG. 9 is a graphical diagram illustrating the concentration distribution in a gallium nitride based semiconductor device according to a variation of this embodiment.

Figure 10:
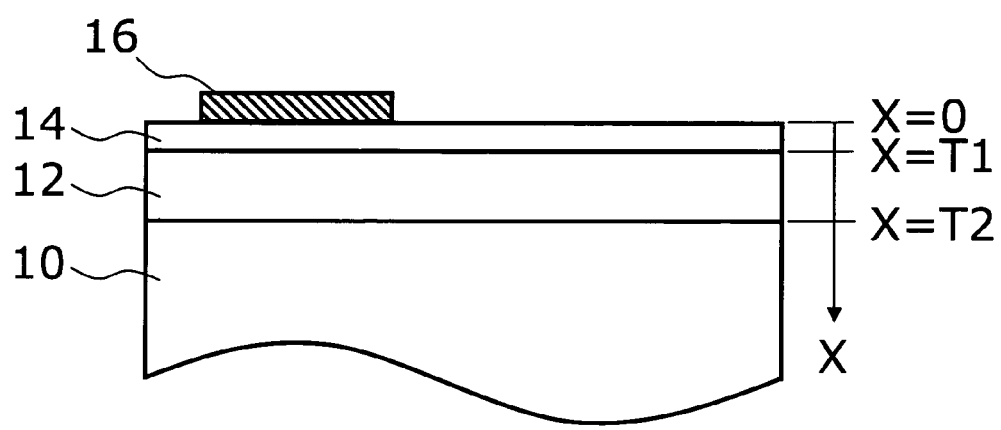
FIG. 10 is a schematic view showing the cross section of the relevant part of the gallium nitride based semiconductor device according to this variation.

FIG. 10 is a schematic view showing the cross section of the relevant part of the gallium nitride based semiconductor device according to this variation.

More specifically, this variation is configured so that, in the second gallium nitride based semiconductor film 14 described above with reference to FIGS. 1 and 2, the region C is removed and the region B is located as a top layer.

This can be formed, for example, by forming a gallium nitride based semiconductor device using the method described above with reference to FIGS. 1 to 8, and then etching the second gallium nitride based semiconductor film 14 to remove the region C. Thus, if the p-side electrode 16 is formed on the region B having a high acceptor concentration, the contact resistance can be reduced with certainty. Furthermore, in this variation, part of the region B may be etched further to expose a region with a higher magnesium concentration to the surface. This allows for reducing the contact resistance with the p-side electrode 16 more effectively.

Next, a semiconductor light emitting device according to a second embodiment of the invention is described.

Figure 11:
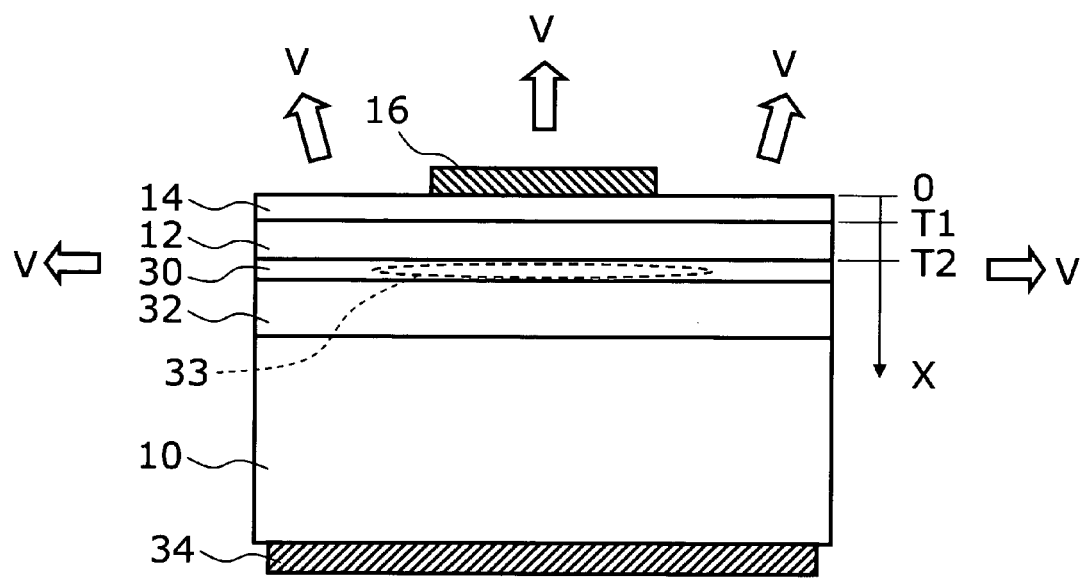
FIG. 11 is a schematic cross section of a gallium nitride based semiconductor device, which is a semiconductor light emitting device according to a second embodiment of the invention.

FIG. 11 is a schematic cross section of a gallium nitride based semiconductor light emitting device according to the second embodiment of the invention.

On an n-GaN substrate 10, an n-GaN foundation layer 32 (with a film thickness of about 2 micrometers), an InGaN-based MQW (Multiple Quantum Well) active layer 30 (with a film thickness of about 0.045 micrometer), a first gallium nitride based semiconductor film 12 (with a film thickness of about 0.5 micrometer) serving as a p-AlGaN cladding layer, and a second gallium nitride based semiconductor film 14 (with a film thickness of about 0.03 micrometer) serving as a p-GaN contact layer are laminated in this order. A p-side electrode 16 is preferably made of thin film metal capable of transmitting light from the active layer 30 (conductive translucent metal). An n-side electrode 34 is formed on the rear side of the n-GaN substrate 10. The active layer can be a MQW structure in which five InGaN well layers (3 nm each) and six InGaN barrier layers (5 nm each) are alternately laminated. A current injected into the InGaN-based MQW active layer 30 generates an emitted light (emitted light V) with an emission wavelength of 380 to 540 nm in an emission region 33 indicated by dashed line.

Crystal growth is performed by the MOCVD method using ammonia, TMG (trimethylgallium), TMA (trimethylaluminum), and TMI (trimethylindium) as a growth source, $Cp_2Mg$ as a p-type impurity source, $SiH_4$ as an n-type impurity source, and hydrogen and nitrogen as a carrier gas as appropriate. In this example of the second embodiment, the first gallium nitride based semiconductor film 12 serving as a p-AlGaN cladding layer is grown in a hydrogen-rich carrier gas atmosphere, which is then switched to a nitrogen-rich carrier gas atmosphere where the second gallium nitride based semiconductor film 14 serving as a p-GaN contact layer is grown. That is, in FIG. 11, T1=0.03 μm and T2=0.53 μm.

In such a laminated body, hydrogen atoms in the first gallium nitride based semiconductor film 12 serving as a cladding layer are ejected outside during the process of growing the second gallium nitride based semiconductor film 14 serving as a contact layer in the nitrogen-rich carrier gas atmosphere. Therefore magnesium in the cladding layer can be activated without postprocessing. Furthermore, because the second gallium nitride based semiconductor film 14 serving as a contact layer is grown in the nitrogen-rich carrier gas atmosphere, hydrogen atoms are prevented from being trapped, which increases the magnesium activation rate. Therefore a low-resistance p-type semiconductor can be obtained without postprocessing.

Moreover, due to the magnesium memory effect, $Cp_2Mg$ and its decomposition products adsorbed on the reaction furnace wall in the hydrogen-rich carrier gas atmosphere are desorbed in the nitrogen-rich carrier gas atmosphere. Because of this desorption, the magnesium concentration increases relative to equilibrium when the growth of the second gallium nitride based semiconductor film 14 is started. Doping with desorbed magnesium involves decreased hydrogen trapping. Therefore the hydrogen atom concentration decreases relative to equilibrium as illustrated in FIG. 1.

As a result of a higher concentration of magnesium doping and a lower atom concentration of hydrogen as described above, the effective acceptor concentration can be increased. If the p-side electrode 16 is formed in this region (that is, the region B in FIG. 1), the contact resistance can be significantly reduced. In order to bring the region B having a high effective acceptor concentration in contact with the p-side electrode, the second gallium nitride based semiconductor film 14 may be grown so thinly that the region B is substantially exposed to the surface, or alternatively, the region C may be removed by etching after the growth as described above with reference to FIGS. 9 and 10. In a semiconductor light emitting device prototyped by the inventors, the operating voltage is improved by about 0.2 V for a driving current of 20 mA.

Next, a semiconductor laser device according to a third embodiment of the invention is described.

Figure 12:
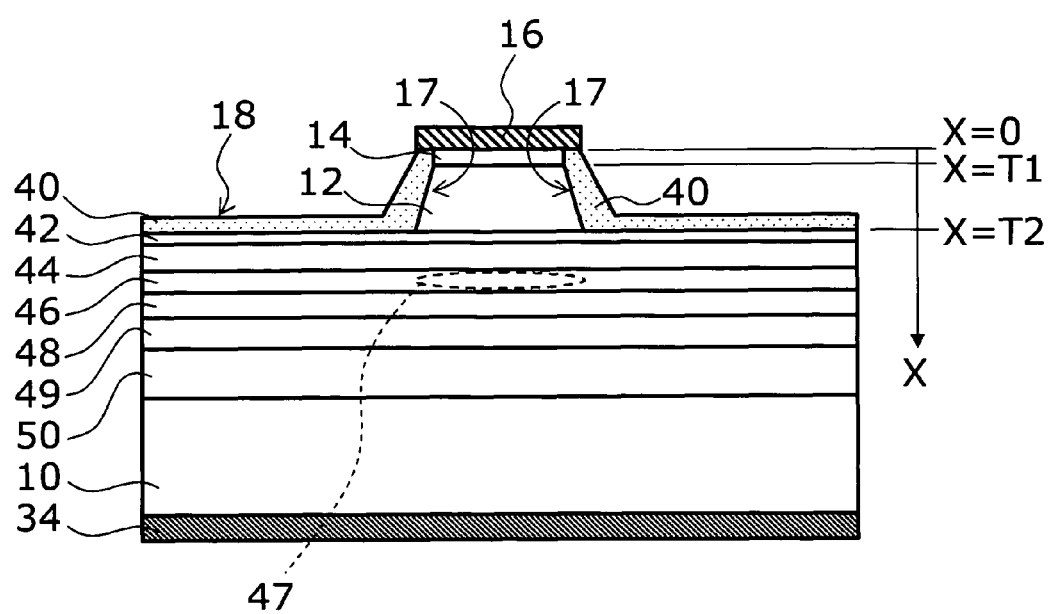
FIG. 12 is a schematic cross section of a gallium nitride based semiconductor device, which is a semiconductor laser device according to a third embodiment of the invention.

FIG. 12 is a schematic cross section of a gallium nitride based semiconductor laser device according to the third embodiment of the invention.

On an n-GaN substrate 10, an n-GaN foundation layer 50 (with a film thickness of 2.0 micrometers), an n-AlGaN cladding layer 49 (with a film thickness of 0.5 micrometer), a GaN guide layer 48 (with a film thickness of 0.1 micrometer), an InGaN-based MQW active layer 46 (with a film thickness of 0.049 micrometer), a GaN guide layer 44 (with a film thickness of 0.1 micrometer), a p-AlGaN overflow blocking layer 42 (with a film thickness of 0.01 micrometer), a first gallium nitride based semiconductor film 12 (with a film thickness of 0.5 micrometer) serving as a p-GaN/AlGaN superlattice cladding layer, and a second gallium nitride based semiconductor film 14 (with a film thickness of 0.03 micrometer) serving as a p-GaN contact layer are laminated in this order. A p-side electrode 16 is connected to the p-GaN contact layer, and an n-side electrode 34 is connected to the bottom side of the n-GaN substrate 10. The active layer 46 is made of a MQW structure in which three InGaN well layers (3 nm each) and four InGaN barrier layers (10 nm each) are alternately laminated.

The first gallium nitride based semiconductor film 12 serving as a p-GaN/AlGaN superlattice cladding layer and the second gallium nitride based semiconductor film 14 serving as a p-GaN contact layer are patterned into a striped ridge waveguide. Subsequently, the ridge side face 17 and ridge periphery 18 are coated with an insulating film 40 made of silicon oxide film or the like. A current injected into the InGaN-based MQW active layer 46 causes a laser light with an emission wavelength of 380 to 450 nm to be emitted in the direction perpendicular to the page. Here, the light is confined in the x direction by the n-AlGaN cladding layer 49 and the p-GaN/AlGaN superlattice cladding layer. On the other hand, along the stripe direction, the light is confined by the ridge waveguide coated with the insulating film 40. As a result, the laser light is emitted from an emission region 47 indicated by dashed line.

Crystal growth is performed by the MOCVD method using ammonia, TMG (trimethylgallium), TMA (trimethylaluminum), and TMI (trimethylindium) as a growth source, $Cp_2Mg$ as a p-type impurity source, $SiH_4$ as an n-type impurity source, and hydrogen and nitrogen as a carrier gas as appropriate. In this example of the third embodiment, the first gallium nitride based semiconductor film 12 serving as a p-GaN/AlGaN superlattice cladding layer is grown in a hydrogen-rich carrier gas atmosphere, which is then switched to a nitrogen-rich carrier gas atmosphere where the second gallium nitride based semiconductor film 14 serving as a p-GaN contact layer is grown. That is, in FIG. 12, T1=0.03 μm and T2=0.53 μm.

In such a laminated body, hydrogen atoms in the first gallium nitride based semiconductor film 12 are ejected outside during the process of growing the second gallium nitride based semiconductor film 14 in the nitrogen-rich carrier gas atmosphere. Therefore magnesium is activated without postprocessing. Furthermore, because the second gallium nitride based semiconductor film 14 is grown in the nitrogen-rich carrier gas atmosphere, hydrogen atoms are prevented from being trapped, which increases the magnesium activation rate. Therefore a p-type semiconductor can be formed without postprocessing.

Moreover, due to the magnesium memory effect, $Cp_2Mg$ and its decomposition products adsorbed on the reaction furnace wall in the hydrogen-rich carrier gas atmosphere are desorbed in the nitrogen-rich carrier gas atmosphere. The desorbed $Cp_2Mg$ and its decomposition products are trapped into the crystal, and thereby the magnesium concentration increases relative to equilibrium when the growth of the second gallium nitride based semiconductor film 14 is started. Doping with desorbed magnesium involves decreased hydrogen trapping. Therefore the hydrogen atom concentration decreases relative to equilibrium as illustrated in FIG. 1. As a result of a higher concentration of magnesium and a lower concentration of hydrogen as described above, the effective acceptor concentration can be increased. If the p-side electrode 16 is formed in this region (region B in FIG. 1), the contact resistance can be significantly reduced.

A semiconductor laser device prototyped by the inventors has good characteristics: continuous wave lasing occurs at an emission wavelength of 410 nm, the operating voltage is 5.0 V for a driving current of 100 mA, and the threshold current density is 3 $kA/cm^2$. In particular, because the contact layer 14 with an increased effective acceptor concentration is formed, the operating voltage is reduced by about 0.5 V.

Next, a heterobipolar transistor according to a fourth embodiment of the invention is described.

FIGS. 13 to 17 are process cross sections of this heterobipolar transistor.

Figure 13:
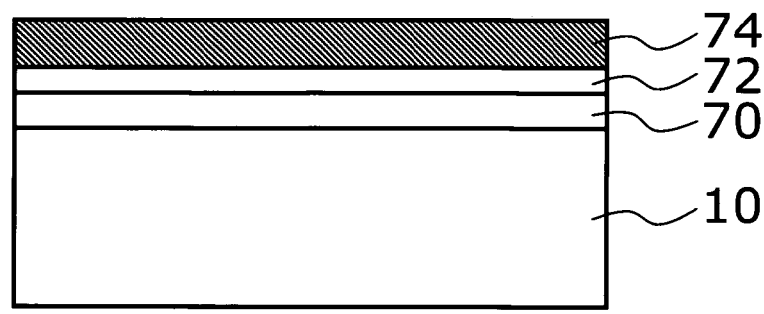
FIGS. 13 to 17 are process cross sections of a gallium nitride based semiconductor device, which is a heterobipolar transistor according to a fourth embodiment of the invention.

First, as illustrated in FIG. 13, on an n-GaN substrate 10, an n⁻-GaN collector layer 70 (with a donor concentration of about $5 \times 10^{16}$ cm$^{-3}$ and a thickness of about 0.7 micrometer), a p-GaN base layer 72 (with a hole concentration of about $5 \times 10^{17}$ cm$^{-3}$ and a thickness of about 0.15 micrometer), and an n$^+$-Al$_{0.1}$Ga$_{0.9}$N emitter layer 74 (with a donor concentration of about $5 \times 10^{18}$ cm$^{-3}$ and a thickness of about 0.5 micrometer) are grown in this order by the MOCVD method, for example. Here, the carrier gas can be hydrogen-rich, the donor can be silicon, and the acceptor can be magnesium.

Figure 14:
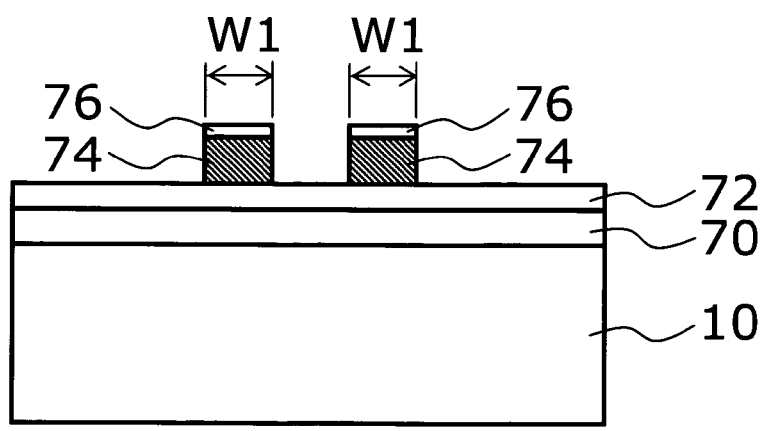

FIG. 14 is a schematic view showing a cross section in which the emitter layer 74 is etched by RIE (Reactive Ion Etching) or the like using a patterned insulating film 76 as a mask. The emitter length L can be 20 to 50 micrometers, and the emitter width W1 can be about 2 micrometers. A large emitter width W1 causes the "current concentration effect" in which the current is concentrated at the periphery and prevented from flowing through the emitter center. This increases the junction capacitance and decreases the current gain. Therefore the emitter width W1 is preferably 1 to 3 micrometers.

Figure 15:
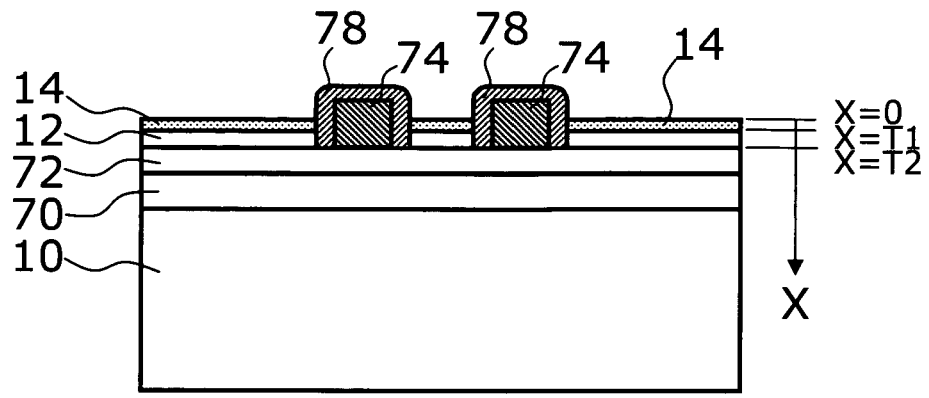

Subsequently, the emitter 74 is coated with silicon nitride or other insulating film 78 and patterned. Then, the MOCVD method is used again to selectively grow a first gallium nitride based semiconductor film 12 (with a film thickness of 0.2 micrometer) and a second gallium nitride based semiconductor film 14 (with a film thickness of 0.03 micrometer) on the p-GaN base layer 72 (FIG. 15). Here, like the first embodiment, the first gallium nitride based semiconductor film 12 is grown in a hydrogen-rich carrier atmosphere. Subsequently, the supply of the group III source gas and Cp$_2$Mg gas is interrupted, the atmospheric gas is switched to nitrogen-rich, and then the source gas and Cp$_2$Mg gas are supplied again.

Due to the memory effect, the magnesium concentration of the second gallium nitride based semiconductor film 14 can be increased relative to the stationary state like the first embodiment (region B). The hydrogen atom concentration can be decreased relative to the stationary state. As a result, the hole concentration can be increased. In general, because the base carrier concentration is not more than $1 \times 10^{18}$ cm$^{-3}$, a contact layer with a higher concentration is required for forming ohmic contact with the base electrode. According to the measurement by the C-V method, the effective acceptor concentration of the second gallium nitride based semiconductor film 14 achieves $1 \times 10^{19}$ cm$^{-3}$. Therefore the region B can be used as a low-resistance contact layer.

Figure 16:
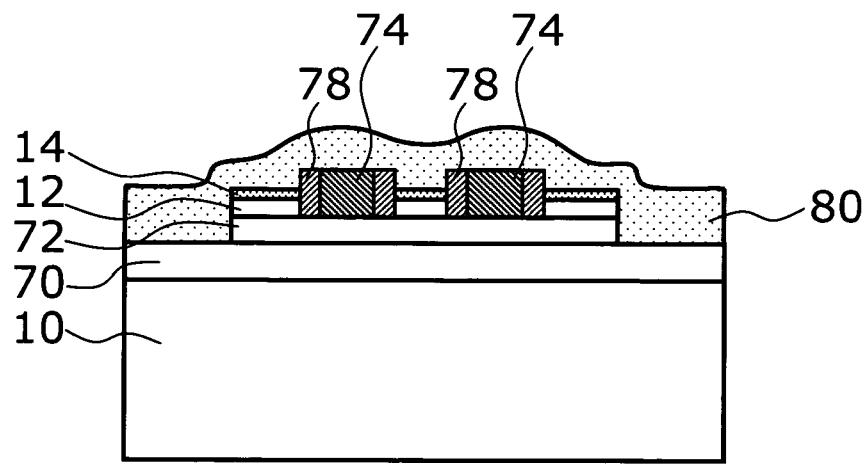

Subsequently, as shown in FIG. 16, the second gallium nitride based semiconductor film 14, the first gallium nitride based semiconductor film 12, and the p-type base layer 72 are patterned using an insulating film (not shown) or resist (not shown) as a mask and are entirely covered with an insulating film (e.g., silicon oxide film) 80.

Then, in order to form an emitter electrode 84 and a base electrode 82, the insulating film 80 is etched away on top of the base layer 72.

Figure 17:
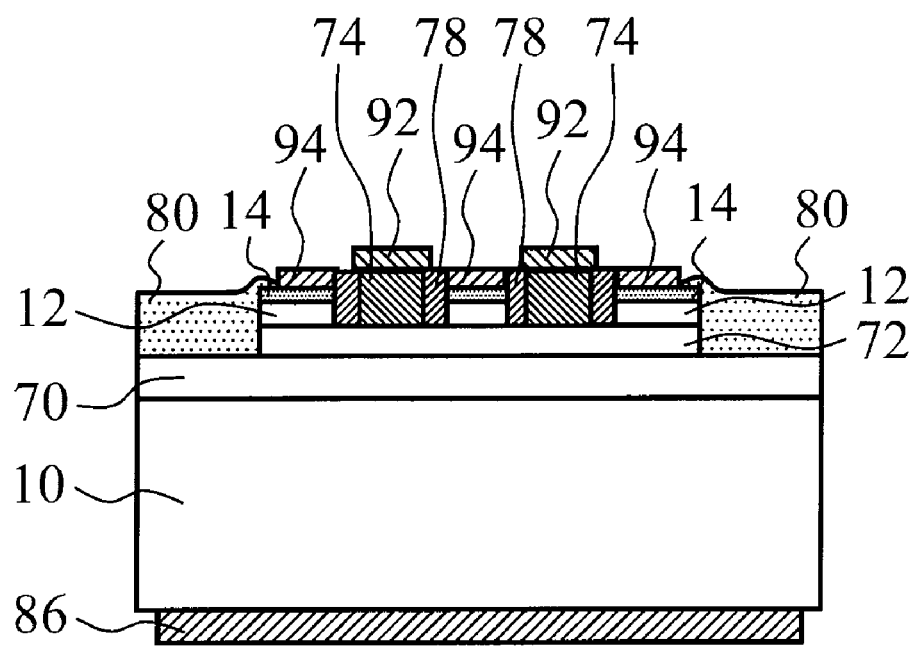

FIG. 17 is a schematic view showing a cross section in which the emitter electrode 84, base electrode 82, and collector electrode (bottom face) 86 have been formed.

These electrodes can be formed by the lift-off process or the like. Here, preferably, the high-concentration region B is brought in contact with the base electrode 82 to reduce resistance by thinly forming the second gallium nitride based semiconductor film 14 or by slightly etching the surface after the film growth as described above with reference to FIGS. 9 and 10.

Figure 18:
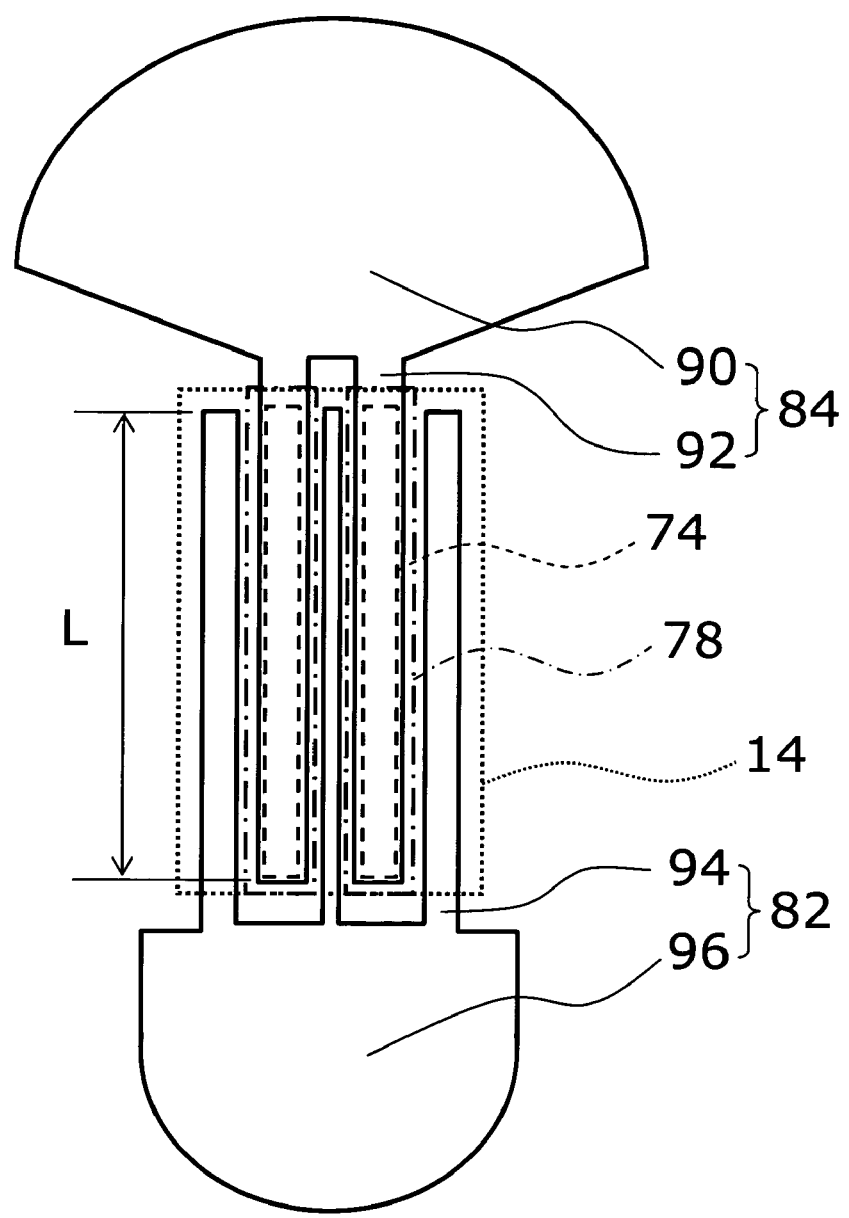
FIG. 18 is a schematic plan view showing the electrode arrangement of the gallium nitride based semiconductor device, which is a heterobipolar transistor according to the fourth embodiment of the invention.

FIG. 18 is a schematic plan view illustrating the arrangement of the emitter and base electrodes.

The emitter electrode 84 is composed of a finger portion 92 covering the emitter of length L and a bonding pad portion 90. The insulating film 80 is provided directly below the bonding pad portion 90. The base electrode 82 is composed of a finger portion 94 and a bonding pad portion 96. Again, the insulating film 80 is provided directly below the bonding pad portion 96. The thickness of the insulating film 80 and the electrode thickness can be appropriately selected to avoid the "step disconnection" of the finger and bonding pad portions. The emitter electrode 84 and collector electrode 86 can be made of Ti/Al/Pt/Au, for example. The base electrode 82 can be made of Ni/Au, for example.

Figure 19:
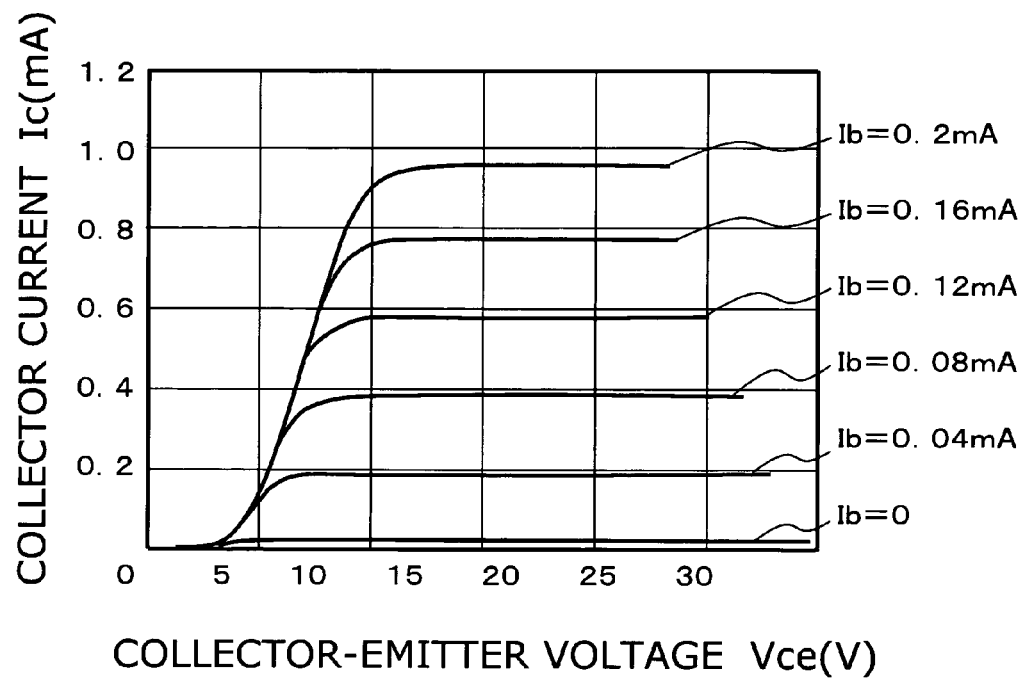
FIG. 19 is a graphical diagram showing the static characteristic of the heterobipolar transistor according to the fourth embodiment of the invention.

FIG. 19 is a graphical diagram illustrating the static characteristic of this heterobipolar transistor.

The current amplification factor ($\beta = I_C/I_B$) is about 4.8 when the collector-emitter voltage $V_{CE}$ is 15 V. The common emitter power gain G of a bipolar transistor is given by $G = f_T/(8\pi f^2 r_B C_C)$, where $f_T$ is the transition frequency, f is the operating frequency, $r_B$ is the base resistance, and $C_C$ is the collector capacitance. The gain G can be increased as the base resistance $r_B$ becomes smaller. Therefore it is preferred to minimize the base contact resistance. Conventionally, the low magnesium concentration and activation rate limited the reduction of the base resistance $r_B$. In this example, crystal growth of the second gallium nitride based semiconductor film 14 in a nitrogen-rich carrier atmosphere yields an effective acceptor concentration that allows for the reduction of the base contact resistance.

The above embodiments refer to the structure that is crystal grown on a GaN substrate. However, this is not intended for limitation. Any substrate allowing GaN-based crystal growth, such as sapphire, alumina (Al$_2$O$_3$), SiC, Si, and GaAs, can be used. Furthermore, the magnesium concentration is not limited to the above examples, but an appropriate value can be selected for individual devices. Besides quartz, the parts of the reaction furnace can be made of SUS, carbon, or these materials with surface coating.

Embodiments of the invention have been described with reference to the examples. However, the invention is not limited thereto.

For example, any size, material, and arrangement of various elements constituting the gallium nitride based semiconductor devices including the semiconductor light emitting device, semiconductor laser device, and heterobipolar transistor, and any method of manufacturing the same, that are variously adapted by those skilled in the art are also encompassed within the scope of the invention as long as they include the features of the invention.

The invention claimed is:

1. A gallium nitride based semiconductor device comprising:
    a first gallium nitride based semiconductor film doped with magnesium; and
    a second gallium nitride based semiconductor film provided on the first gallium nitride based semiconductor film and doped with magnesium,
    the first gallium nitride based semiconductor film having substantially flat distributions of magnesium concentration and hydrogen atom concentration, and the magnesium concentration being higher than the hydrogen atom concentration, and the second gallium nitride based semiconductor film having a first region in which the magnesium concentration decreases and the hydrogen atom concentration increases toward the surface, and the magnesium concentration in the first region being higher than the hydrogen atom concentration in the first region and higher than the magnesium concentration in the first gallium nitride based semiconductor film.

2. A gallium nitride based semiconductor device according to claim 1, further comprising:
a light emitting layer provided below the first gallium nitride based semiconductor film; and
a p-side electrode provided on the second gallium nitride based semiconductor film, wherein
light emission occurs by injecting a current into the light emitting layer via the p-side electrode.

3. A gallium nitride based semiconductor device according to claim 1, wherein the second gallium nitride based semiconductor film has a second region having substantially flat distributions of magnesium concentration and hydrogen atom concentration.

4. A gallium nitride based semiconductor device according to claim 3, wherein the magnesium concentration in the second region is higher than the hydrogen atom concentration in the second region.

5. A gallium nitride based semiconductor device according to claim 2, wherein the first gallium nitride based semiconductor film is made of AlGaN, and the second gallium nitride based semiconductor film is made of GaN.

6. A gallium nitride based semiconductor device according to claim 1, wherein the second gallium nitride based semiconductor film has a third region which is provided between the first gallium nitride based semiconductor film and the first region, and in which the magnesium and hydrogen atom concentrations increase toward the first region.

7. A gallium nitride based semiconductor device according to claim 1, further comprising:
a collector layer made of an n-type, third gallium nitride based semiconductor film provided on a substrate;
a base layer made of a p-type, fourth gallium nitride based semiconductor film provided on part of the collector layer and below the first gallium nitride based semiconductor film;
an emitter layer made of an n-type, fifth gallium nitride based semiconductor film provided on part of the base layer; and
a base electrode provided on the second gallium nitride based semiconductor film, wherein the collector layer, the base layer, and the emitter layer constitute a heterobipolar transistor.

8. A gallium nitride based semiconductor device according to claim 1, wherein the magnesium concentration in the second gallium nitride based semiconductor film has a maximum of not less than $1 \times 10^{20}$ cm$^{-3}$.

9. A gallium nitride based semiconductor device comprising:
a first gallium nitride based semiconductor film doped with magnesium; and
a second gallium nitride based semiconductor film provided on the first gallium nitride based semiconductor film and doped with magnesium,
the first gallium nitride based semiconductor film having substantially flat distributions of magnesium concentration and hydrogen atom concentration, and the magnesium concentration being higher than the hydrogen atom concentration, and the second gallium nitride based semiconductor film having a first region in which the magnesium concentration and the hydrogen atom concentration increase toward a surface, and the magnesium concentration in the first region being higher than the hydrogen atom concentration in the first region and higher than the magnesium concentration in the first gallium nitride based semiconductor film.

10. A gallium nitride based semiconductor device according to claim 9, wherein the second gallium nitride based semiconductor film has a second region in which the magnesium concentration decreases and the hydrogen atom concentration increases toward the surface, and the magnesium concentration in the second region being higher than the hydrogen atom concentration in the second region and higher than the magnesium concentration in the first gallium nitride based semiconductor film.

11. A gallium nitride based semiconductor device according to claim 9, further comprising:
a light emitting layer provided below the first gallium nitride based semiconductor film; and
a p-side electrode provided on the second gallium nitride based semiconductor film, wherein
light emission occurs by injecting a current into the light emitting layer via the p-side electrode.

12. A gallium nitride based semiconductor device according to claim 9, wherein the first gallium nitride based semiconductor film is made of AlGaN, and the second gallium nitride based semiconductor film is made of GaN.

13. A gallium nitride based semiconductor device according to claim 12, wherein the light emitting layer is made of InGaN.

14. A gallium nitride based semiconductor device according to claim 9, further comprising:
a collector layer made of an n-type, third gallium nitride based semiconductor film provided on a substrate;
a base layer made of a p-type, fourth gallium nitride based semiconductor film provided on part of the collector layer and below the first gallium nitride based semiconductor film;
an emitter layer made of an n-type, fifth gallium nitride based semiconductor film provided on part of the base layer; and
a base electrode provided on the second gallium nitride based semiconductor film, wherein the collector layer, the base layer, and the emitter layer constitute a heterobipolar transistor.

15. A gallium nitride based semiconductor device according to claim 9, wherein the magnesium concentration in the second gallium nitride based semiconductor film has a maximum of not less than $1 \times 10^{20}$ cm$^{-3}$.

16. A method of manufacturing a gallium nitride based semiconductor device comprising:
growing a first gallium nitride based semiconductor film doped with magnesium by using a metal organic chemical vapor deposition method and feeding a carrier gas containing hydrogen and nitrogen, a flow rate of hydrogen being larger than a flow rate of nitrogen;
temporarily interrupting supply of a group III source gas after growing the first gallium nitride based semiconductor film; and
growing a second gallium nitride based semiconductor film doped with magnesium on the first gallium nitride based semiconductor film by using the metal organic chemical vapor deposition method and feeding a carrier gas containing nitrogen and hydrogen, a flow rate of nitrogen being larger than a flow rate of hydrogen.

17. A method of manufacturing a gallium nitride based semiconductor device according to claim 16, wherein the growing the second gallium nitride based semiconductor film includes forming a first region in which the magnesium concentration and the hydrogen atom concentration increase toward a surface.

18. A method of manufacturing a gallium nitride based semiconductor device according to claim 17, wherein the growing the second gallium nitride based semiconductor film further includes forming a second region in which the magnesium concentration decreases and the hydrogen atom concentration increases toward the surface.

19. A method of manufacturing a gallium nitride based semiconductor device according to claim 18, wherein the growing the second gallium nitride based semiconductor film further includes forming a third region having substantially flat distributions of magnesium concentration and hydrogen atom concentration.

20. A method of manufacturing a gallium nitride based semiconductor device according to claim 16, wherein quartz is used in at least part of a reaction furnace provided in a metal organic chemical vapor deposition apparatus and fed with a growth gas.

* * * * *